(12) United States Patent
Lee et al.

(10) Patent No.: US 10,527,936 B2
(45) Date of Patent: Jan. 7, 2020

(54) LOW DK/DF SOLDER RESISTANT COMPOSITION USE FOR PRINTED CIRCUIT BOARD

(71) Applicant: NAN YA PLASTICS CORPORATION, Taipei (TW)

(72) Inventors: Cheng-Chung Lee, Taipei (TW); Yeong-Tong Hwang, Taipei (TW); Shih-Hung Hsu, Taipei (TW); Shao-En Hwang, Taipei (TW)

(73) Assignee: NAN YA PLASTICS CORPORATION, Taipei (TW)

( * ) Notice: Subject to any disclaimer, the term of this patent is extended or adjusted under 35 U.S.C. 154(b) by 0 days.

(21) Appl. No.: 15/185,841

(22) Filed: Jun. 17, 2016

(65) Prior Publication Data

US 2017/0363958 A1 Dec. 21, 2017

(51) Int. Cl.
*G03F 7/031* (2006.01)
*G03F 7/038* (2006.01)
(Continued)

(52) U.S. Cl.
CPC .............. *G03F 7/031* (2013.01); *G03F 7/027* (2013.01); *G03F 7/038* (2013.01); *G03F 7/0385* (2013.01);
(Continued)

(58) Field of Classification Search
CPC ........ G03F 7/031; G03F 7/0385; G03F 7/038; G03F 7/027; G03F 7/0388; G03F 7/0047; H05K 3/3452
See application file for complete search history.

(56) References Cited

U.S. PATENT DOCUMENTS 5,049,628 A * 9/1991 Nawata ............... C08F 299/026
525/481
5,858,618 A * 1/1999 Tzou ....................... G03F 7/027
430/280.1
(Continued)

FOREIGN PATENT DOCUMENTS

CN 1223727 A 7/1999
CN 1236115 A 11/1999
(Continued)

OTHER PUBLICATIONS

Registry No. 177646-12-7, Kayacure ITX from SciFinder database, one page American cheimcal Society copy right printed out Dec. 1, 2016 one page.*

*Primary Examiner* — Cynthia Hamilton
(74) *Attorney, Agent, or Firm* — Li & Cai Intellectual Property (USA) Office

(57) ABSTRACT

A low dielectric constant (Dk) and dissipation factor (Df) of solder resistant mask composition comprising (A) a photopolymerizable prepolymer of formula (1); (B) a photopolymerizable vinyl monomer; (C) an epoxy compound; (D) a photopolymerization initiator; (E) an inorganic filler; (F) a catalyst; and (G) an organic solvent. The low dielectric constant (Dk) and dissipation factor (Df) of solder resistant mask composition has excellent photo and thermocurability, and high developability resolution with an alkaline aqueous solution, wherein the dielectric constant is below 3.20 (1 GHz), and the dissipation factor is less than 0.015 (1 GHz);

Formula (1)

where n and m each is an integer and is greater than zero;

(Continued)

Y:

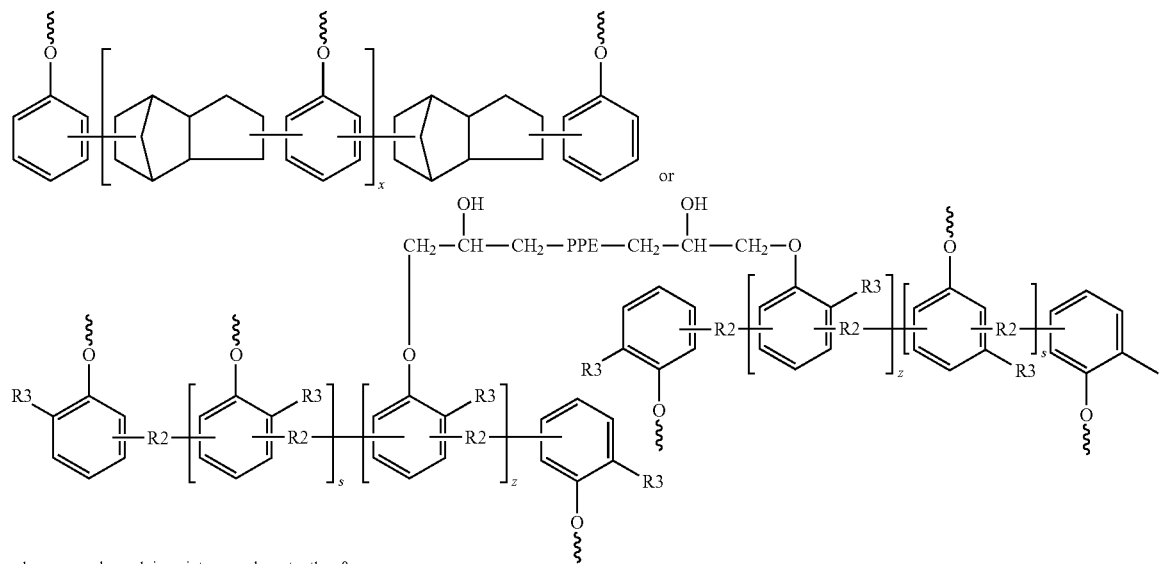

where x, s and z each is an integer and greater than 0;

R2:

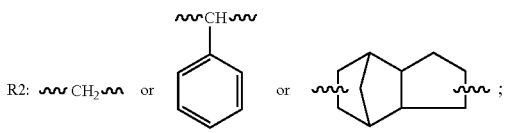

R3: H or CH₃;

PPE:

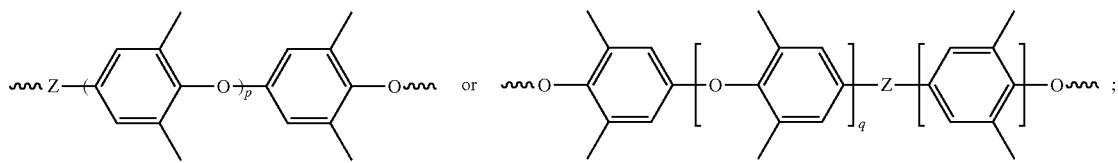

where p and q is an integer and greater than 1, and where

Z:

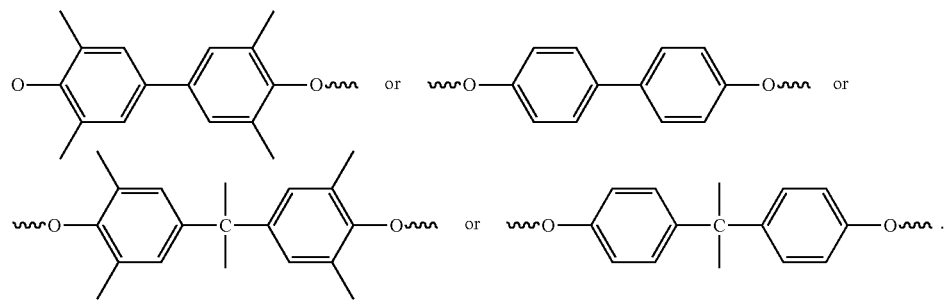

9 Claims, No Drawings

(51) Int. Cl.
 G03F 7/027 (2006.01)
 H05K 3/34 (2006.01)
 G03F 7/004 (2006.01)
(52) U.S. Cl.
 CPC ......... *G03F 7/0388* (2013.01); *H05K 3/3452* (2013.01); *G03F 7/0047* (2013.01)

(56) References Cited

U.S. PATENT DOCUMENTS

| 8,716,413 | B2* | 5/2014 | Dudde | C08G 59/1466 |
| | | | | 525/523 |
| 2001/0026905 | A1* | 10/2001 | Uetani | G03F 7/0226 |
| | | | | 430/311 |
| 2002/0136986 | A1* | 9/2002 | Chang | G03F 7/0047 |
| | | | | 430/280.1 |
| 2005/0223940 | A1 | 10/2005 | Seeger et al. | |
| 2007/0129502 | A1 | 6/2007 | Kawabe et al. | |

(56) References Cited

U.S. PATENT DOCUMENTS

| | | | | |
|---|---|---|---|---|
| 2014/0099581 A1* | 4/2014 | Inagaki | ................... | G03F 7/038 430/280.1 |
| 2015/0024326 A1* | 1/2015 | Nawrocki | ............. | G03F 7/0045 430/280.1 |
| 2017/0363958 A1* | 12/2017 | Lee | ......................... | G03F 7/031 |

FOREIGN PATENT DOCUMENTS

| | | | |
|---|---|---|---|
| CN | 1364247 | A | 8/2002 |
| CN | 1506153 | A | 6/2004 |
| CN | 102819190 | A | 12/2012 |
| EP | 3243854 | A1 * | 11/2017 |
| JP | H 07157703 | A | 6/1995 |
| JP | 2003048932 | A | 2/2003 |
| JP | 2014115365 | A | 6/2014 |
| JP | 2014126663 | A | 7/2014 |
| TW | 201113323 | A1 | 4/2011 |
| WO | WO 03059975 | A1 | 7/2003 |
| WO | 2013031736 | A1 | 3/2013 |

\* cited by examiner

LOW DK/DF SOLDER RESISTANT COMPOSITION USE FOR PRINTED CIRCUIT BOARD

TECHNICAL FIELDS

The present invention relates to a novel low Dk/Df solder resistant composition with outstanding developing performance and photo-hardening force; and the printed circuit board manufactured has excellent adhesion, chemical resistance, electric characteristics, plating resistance, solder heat resistance, electric erosion resistance, etc., as well as dielectric constant of less than 3.20 (1 GHz) and dissipation factor Df of less than 0.015 (1 GHz); and the low Dk/Df solder resistant composition is applicable for the high-performance and high-frequency printed circuit board.

PRIOR ART

Liquid solder resistant composition or dry membrane having excellent developability and dimension precision has been widely applied to the method of manufacturing photoresisting patterns of all kinds of printed circuit boards in recent years in order to keep up with the high wiring density of the printed circuit board, especially the hardened solder resistant coating with excellent physical property can be prepared finally from the solder resistant composition formed by the ultraviolet curable resin (photopolymerizable prepolymer (oligomer)) prepared from multifunctional phenolic aldehyde epoxy acrylic resin or multifunctional o-cresol formaldehyde epoxy acrylate to which polybasic anhydride-anhydride is added and the epoxy resin composition after heating and hardening when the ultraviolet ray is applied to hardening.

The solder resistant composition formed by the photopolymerizable prepolymer (oligomer) prepared from phenolic aldehyde epoxy acrylic resin or multifunctional o-cresol formaldehyde epoxy acrylate and the common epoxy resin, such as the crystalline epoxy resin or any di-functional group epoxy resin has the dielectric constant Dk of about 3.6 (1 GHz) and dissipation factor Df of about 0.025 (1 GHz) and cannot acquire the transmission characteristics of electronic signal; however, the upstream raw materials of the printed circuit board are required to have low dielectric constant Dk and dissipation factor Df along high-frequency and high-speed development of the electronic product and increasing transmission speed, and the solder resistant composition also becomes the key and important raw material for protecting circuit. Therefore, to develop the solder resistant composition having low dielectric constant/dissipation factor and meeting the physical property of the printed circuit board is crucial problem in the future.

SUMMARY OF THE INVENTION

The developing direction in the future shall require the upstream raw materials of the printed circuit board to have lower dielectric constant Dk and dissipation factor Df consecutively because the electronic product requires the faster transmission speed of high-frequency signal. As the important materials of resisting soldering and protecting the circuit of the printed circuit board, to develop the solder resistant composition of low dielectric constant Dk and dissipation factor Df shall be the crucial subject.

The present invention is to provide the novel low Dk-Df solder resistant composition with outstanding developing performance and photo-hardening force, and the printed circuit board manufactured has excellent adhesion, chemical resistance, electric characteristics, plating resistance, solder heat resistance, electric erosion resistance, etc., as well as dielectric constant of less than 3.20 (1 GHz) and dissipation factor Df of less than 0.015 (1 GHz); and the low Dk/Df solder resistant composition is applicable for the high-performance and high-frequency printed circuit board.

The novel low Dk/Df solder resistant composition comprising following components (A) a photopolymerizable prepolymer (oligomer) (represented by formula 1) is 20 to 70 weight %, prepared by reacting (a1) dicyclo pentadiene-phenol novolac multifunctional epoxy, or (a2) polyphenyl ether modified epoxy resin multifunctional epoxy or any combination of two (a1), (a2) with (b) mono carboxlic acid containing a vinyl group, then reacting with (c) a saturated or unsaturated poly anhydride acid;

(B) a photopolymerizable vinyl monomer is 0 to 20 weight % as thinner;

(C) an epoxy compound is 5 to 30 weight %, wherein the epoxy compound comprising (C1) dicyclo pentadiene-phenol novolac multifunctional epoxy resin or polyphenyl ether modified epoxy resin or any combination of the forgoing two kinds of resins. And (02) tetra methyl biphenol epoxy resin;

(D) a photopolymerization initiator is 2 to 10 weight %, (E) an inorganic filler 10~50 weight %;

(F) a catalyst 0~2.0 weight %;

(G) an organic solvent 10~40 weight %;

Formula (1)

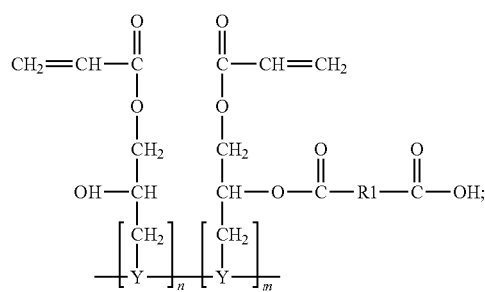

where n and m each is an integer and is greater than zero;

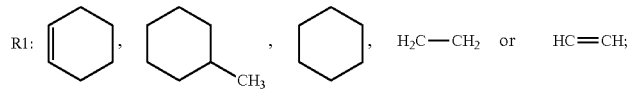

Y is
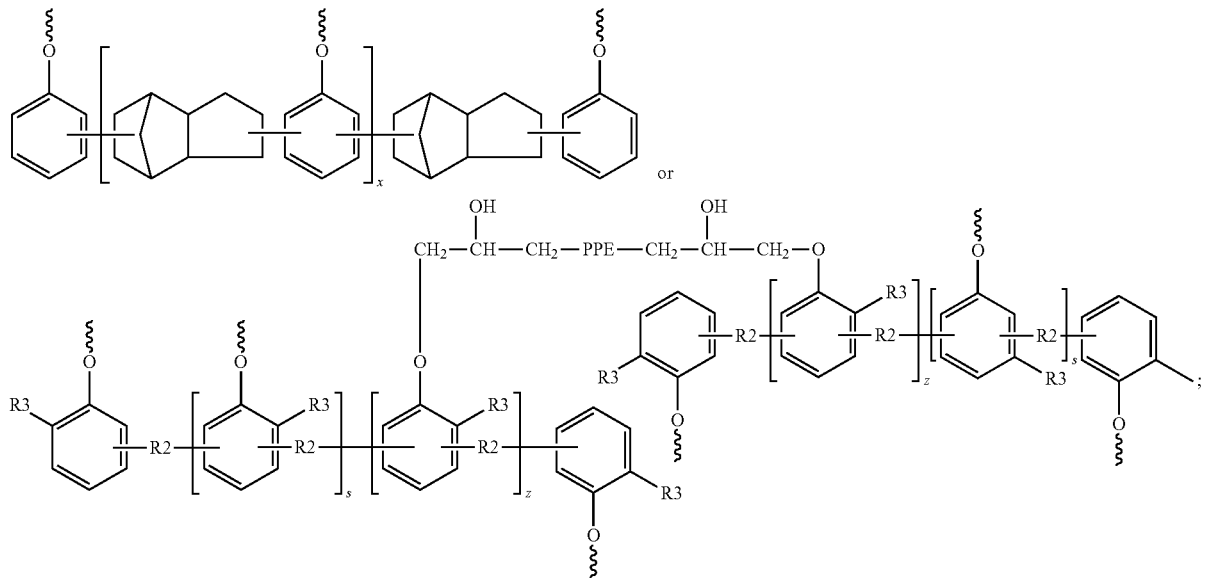
a1
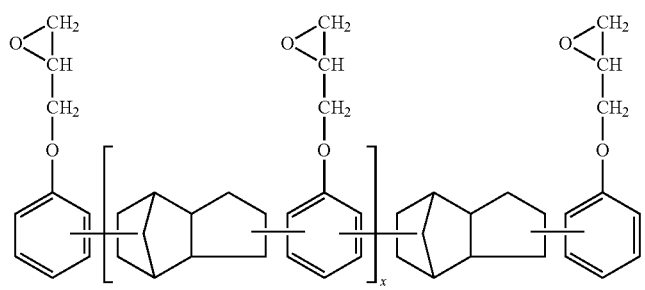
a2
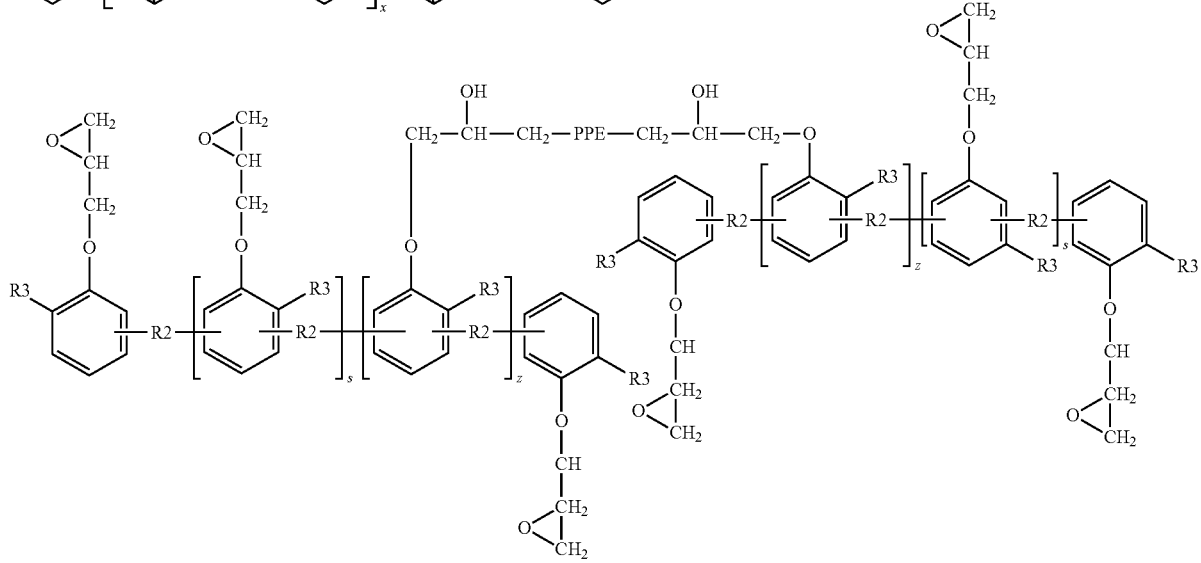
where x, s and z each is an integer and greater than 0;
R2: 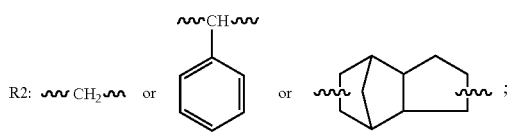
R3: H or CH3;

PPE:

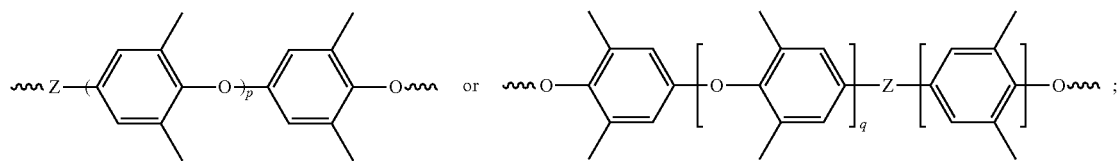

p, q > 1, integer

Z:

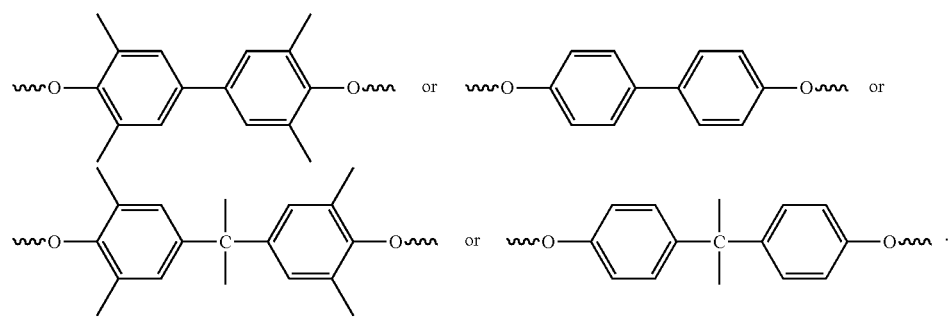

where x, s and z each is an integer and greater than 0;
wherein, the above-mentioned (a1) dicyclo pentadiene-phenol novolac multifunctional epoxy, and (a2) polyphenyl ether modified epoxy resin multifunctional epoxy are as following:

The novel low dielectric constant (Dk)/dielectric dissipation factor (Df) solder resistant composition of the invention is characterized in that the photopolymerizable prepolymer (referred as oligomer, represented by Formula 1) with low dielectric constant and dissipation factor is put forward and by which the photopolymerizable prepolymer (referred as oligomer) with low dielectric constant and dissipation factor can be synthesized and prepared by reacting the multifunctional epoxy resin having low polarity and high-symmetry chemical structure, such as dicyclo pentadiene-phenol novolac multifunctional epoxy resin or polyphenyl ether PPE modified epoxy resin with single carboxylic acid with one ethylene group and reacting with the saturated or unsaturated poly anhydride acid, and the main formula of the solder resistant composition can be formed by adding the heat curing agent of epoxy resin compound. The curing agent epoxy resin compound is in a low polarity and high-symmetry chemical structure, for example, the effect of low Dk/Df can be implemented by means of dicyclo pentadiene-phenol novolac multifunctional epoxy resin or polyphenyl ether PPE modified epoxy resin and the crystalline tetramethyl diphenol epoxy resin; the dielectric constant and dissipation factor are lower if the active ester resin (arylesterized the phenolic hydroxyl group of the polyhydric phenol compound) is added; and the active ester resin is to play the role of preventing production of hydroxyl (OH group) polar group as a result of ring opening of the epoxy resin; the solder resist hardening coating refers to polymer comprising bridged after hardening of the photopolymerizable prepolymer (referred as oligomer) (add value 20~100 mgKOH/g) and the epoxy resin by means of ultraviolet ray and heating for reaction, wherein the equivalence ratio of the photopolymerizable prepolymer (oligomer) to the epoxy resin is 1 : (1.0-5.0) usually, and the epoxy resin shall provide excellent heat resistance, adhesion, chemical resistance, but the epoxy resin shall generate adverse factors to reduction of dielectric constant and dissipation factor as a result of polar group of hydroxyl (OH group) due to ring opening; the low-polarity ester may generated by the acyl in the active ester resin and the hydroxyl bond of the polar group after adding the active ester group resin, and therefore the problem that the dielectric constant and dissipation factor cannot be reduced easily as a result of hydroxyl generated after opening of the ring of the epoxy resin can be solved, and the low Dk/Df effect can be achieved relatively.

The content of the low Dk/Df solder resistant composition of the invention shall be detailed as follows: the component (A) photopolymerizable prepolymer (oligomer) is included and 20-70 weight % preferably, 30-60 weight % most preferably, and synthesized and prepared by reacting (a) low-Dk multifunctional epoxy resin with (b) mono carboxlic acid comprising at least one vinyl group, and reacting with (c) saturated or unsaturated poly anhydride acid, wherein the best effect can be acquired when the reaction condition is within following range: the low-Dk multifunctional epoxy resin shall prevail in terms of quantity for reaction between the (a) low-Dk multifunctional epoxy resin and (b) mono carboxlic acid comprising at least one vinyl group, and epoxy group of each equivalent weight shall be 0.5-1.2 mole preferably, and 0.9-1.1 mole most preferably. During the reaction, the organic solvent shall be applied to dilution, such as petroleum-based aromatic solvent, propylene carbonate, butoxyethanol, butoxyethyl acetate, methylbenzene, dimethylbenzene, butyl carbitol acetate, cyclohexanone, propylene glycol monomethyl ether, dipropylene glycol diethyl ether, methyl carbitol acetate, etc.; and the catalyst is added, such as triphenylphosphine, triethylamine, methyltriethylammonium chloride, etc., wherein the triphenylphosphine shall be the best choice. The catalyst shall be 0.1-10 weight % of the total amount of the mixture for reaction preferably. The thermal polymerization inhibitor shall be added, such as p-dihydroxybenzene and hydroquinone dimethyl ether in order to prevent polymerization during reaction. The polymerization inhibitor shall be 0.01-1 weight % of the mixture for reaction after feeding preferably, and the reaction temperature shall be at 80-120° C. preferably, and the reaction shall be lasted for 6-24 h. And the step of reacting with (c) saturated or unsaturated anhydride shall be lasted, and the hydroxyl generated during reaction between the carboxyl and the epoxy group shall prevail in terms of quantity of poly anhydride used, the 0.1-1.0 mole of poly anhydride shall be applied to the hydroxyl of equivalent weight, and 0.3-0.8 mole most preferably; the reaction shall be implemented at 80-120° C. preferably, and the reaction shall be lasted for 4-16 h. Moreover, the acid value (mg KOH/g) of the photopolymerizable prepolymer (oligomer) (A) acquired in this way shall be 20-100 preferably, and 40-80 most preferably.

(a) low-Dk multifunctional epoxy resin is selected from a1 dicyclo pentadiene-phenol novolac multifunctional epoxy resin (produced by Nan Ya Plastics Corporation, with trademark NPPN-272H, equivalent of epoxy EEW of 272 g/eq and softening point at 78~85° C.) or a2 polyphenyl ether modified epoxy resin (produced by Nan Ya Plastics Corporation, with trademark NPPN-433PT60, equivalent of epoxy EEW of 340 g/eq, average molecular weight of Mn1300 and solid content of 60%) or arbitrary combinations of the above-mentioned two epoxy resins.

(b) mono carboxlic acid comprising at least one vinyl group is selected from acrylic acid, methylacrylic acid, crotonic acid, cinnamic acid, and acrylic acid shall be preferable in the embodiment.

(c) saturated or unsaturated poly anhydride acid is selected from succinic anhydride, hexahydrophthalic anhydride, cis-4-methyl-1,2,3,6-tetrahydrophthalic anhydride, 2,3,6-tetrahydro-3-phthalic anhydride, maleic anhydride, etc., and 2,3,6-tetrahydro-3-phthalic anhydride shall be preferable in the embodiment.

The dosage of the component (B) photopolymerizable vinyl monomer of the solder resistant composition with low dielectric constant and dissipation factor in the invention is 0-20 weight % preferably, and 5-15 weight % most preferably; further, the component (B) is selected from acrylate comprising tripolycyanamide, hydroxyalkyl acrylate, such as mono acrylic acid or diacrylic acid compound of 2-hydroxyethyl acrylate, 2-hydroxybutyl acrylate, dihydric alcohol (such as glycol, polyglycol, propanediol), alkyl amine acrylic acid compound, such as acrylic acid-nitrogen, nitrogen-dimethylaminoethyl, polyhydrol (such as glycol, trimethyipropane, pentaerythritol, dipentaerythritol) and ethylene oxide, multifunctional acrylate of propylene oxide (which can be adducted itself), and acrylate of allyl glycidyl ether (glycidyl diepoxy ether, trimethyloipropane diepoxypropyl ether, melaminecyanurate triepoxy isoamyl propionate), and acrylate or pentaerythritol of tripolycyanamide, multifunctional acrylate of dipentaerythritol most preferably.

The dosage of the component (C) epoxy resin compound of the solder resistant composition with low dielectric constant and dissipation factor in the invention is 5-30 weight %, and 10-25 weight % most preferably, and the epoxy resin compound is selected from (C1) dicyclo pentadiene-phenol novolac multifunctional epoxy resin (produced by Nan Ya Plastics Corporation, with trademark NPPN-272H, equivalent of epoxy EEW of 272 g/eq and softening point at 78~85° C.) or polyphenyl ether modified epoxy resin (produced by Nan Ya Plastics Corporation, with trademark NPPN-433PT60, equivalent of epoxy EEW of 340 g/eq and average molecular weight of Mn1300) or phenol-benzaldehyde novolac multifunctional epoxy resin (produced by Nan Ya Plastics Corporation, with trademark NPPN-433, equivalent of epoxy EEW of 230 g/eq and average molecular weight of Mn1150) or arbitrary combinations of the above-mentioned three epoxy resins, (C2) tetra methyl biphenol epoxy resin, and (C3) the active ester resin (aryl-esterized the phenolic hydroxyl group of the polyhydric phenol compound) of any esterified structure of phenolic resin.

The epoxy resin compound is applied to crosslinking with the (A) polymerizable oligomer as the heat hardening agent; while the acid equivalent of the above-mentioned polymerizable oligomer shall prevail in terms of dosage of the epoxy resin compound used, and 1.0-5.0 mole of epoxy group shall be applied to the carboxylic group equivalently, preferably 1.0-2.5 mole.

The total epoxy resin (C1)+(C2) shall prevail in terms of dosage of (C3) active ester resin, preferably 0-1.0 mole active ester resin shall be applied to the epoxy group equivalently; the minority of the hydroxyl (OH group) is reservable when the amount of the active ester resin is less than the equivalent weight of the epoxy resin in order to acquire better adhesion effect. Further, the equivalent weight of the active ester resin is 190~280 g/eq.

The dosage of the component (D) photopolymerization initiator of the solder resistant composition with low dielectric constant and dissipation factor in the invention, the total amount of resin is 2-10 weight %, preferably 2-8 weight %, and the photopolymerization initiator is selected from any of known photoinitiators, such as benzoin methyl ether, benzoin, isopropyl ether, 2,2-dimethyl-2-phenylacetophenone, 1,1-dichloroacetophenone, 1-hydroxy cyclohexyl phenyl ketone, 2-methyl-1-[4-(methylthio) phenyl]-2-morpholinylacet-1-one, N,N-dimethyl amino acetophenone, 2,4-dimethyl 9-oxdibenzothian, 2,4-diethyl 9-oxdibenzothian, 2-chloro-9-oxdibenzothian, 2,4-diisopropyl 9-oxdibenzothian, benzophenone dimethyl acetal, diphenylketone, methyl diphenylketone, 4,4'-dichlorobenzophenone, 4,4'-diethylamino phenyl ketone, Michler's ketone, 4-phenylmethylacyldiphenyl phosphorus oxide etc. which can be used separately or after mixing. Moreover, the best combination shall be 2-methyl-1-[4-(methylthio) phenyl]-2-morpholinylacet-1-one (Irgacure 907) and 2,4-diisopropyl 9-oxdibenzothian (Kayacure ITX manufactured by the chemical company in Japan).

The dosage of the component (E) inorganic filler of the solder resistant composition with low dielectric constant and dissipation factor in the invention is 10-50 weight % preferably, 15-35 weight % most preferably. The inorganic filler used by the composition of the invention is the one applied widely, such as mixture of talcum powder, magnesium carbonate, calcium carbonate, alumina, powder of silicon dioxide, etc.

The dosage of the component (F) accelerant of the solder resistant composition with low dielectric constant and dissipation factor in the invention is 0-2.0 weight % and 0.1-1.0 weight % most preferably, the accelerant, as the hardening accelerant, can be selected from imidazoles, quaternary ammonium compounds, quaternary phosphates, and usually dimethyl imidazole, diphenylimidazole, bis(hydroxymethyl) diphenylimidazole, etc.

The dosage of the component (G) organic solvent of the solder resistant composition with low dielectric constant and dissipation factor in the invention is 10-40 weight % and 10-30 weight % most preferably. Moreover, the organic solvent is selected from propylene carbonate, butoxyethanol, butoxyethyl acetate, methylbenzene, dimethylbenzene, butyl carbitol acetate, cyclohexanone, propylene glycol monomethyl ether, dipropylene glycol diethyl ether, methyl carbitol acetate, etc.; and the propylene carbonate and the butoxyethyl acetate shall be preferable in the embodiment.

The technical solution of the invention has at least following beneficial effects:

The solder resistant composition can be prepared by steps of hardening by using ultraviolet ray and drying and hardening by means of heat after reacting dicyclo pentadiene-phenol novolac epoxy resin or polyphenyl ether modified multifunctional epoxy resin with mono carboxlic acid comprising a vinyl group, synthesizing the low Dk/Df photopolymerizable prepolymer (oligomer) after reacting with the saturated or unsaturated poly anhydride acid; substituting into the formula of the composition and adding the low Dk/Df epoxy resin compound (such as dicyclo pentadiene-phenol novolac epoxy resin or polyphenyl ether modified multifunctional epoxy resin and the crystalline tetramethyl diphenol epoxy resin). The invention is featured with excellent electrical property, low Dk/Df, high analyticity and developability, excellent adhesion, chemical resistance, electric characteristics, plating resistance, heat resistance of soldering materials, galvanic corrosion resistance, etc., and meets the characteristic requirements of high-frequency high-speed and high-order printed circuit board. Moreover, the Dk/Df can be further reduced if the active ester resin is added to the formula of the composition.

DETAILED DESCRIPTION OF THE PREFERRED EMBODIMENT

The preferable specific embodiment shall be clarified further in order to understand the invention more clearly, and explanations shall be detailed according to following embodiments.

Synthesis Example 1: Photopolymerizable Prepolymer (Oligomer)-A1

Add 390 g solvent KA to 1000 g dicyclo pentadiene-phenol novolac multifunctional epoxy resin (produced by Nan Ya Plastics Corporation, with trademark NPPN-272H and equivalent of epoxy EEW of 272 g/eq); add 4.5 g triphenyl phosphine and 1.0 g hydroquinone HQ after heating the mixture to 100° C., stir and dissolve the mixture and drop 265 g acrylic acid AA to the above-mentioned solution to carry out reaction, wherein the reaction time during dropping shall be 90 min; the temperature during dropping shall be at 95° C.; implement ripening reaction for 12 h by heating the mixture to 120° C. after dropping; add 380 g tetrahydrophthalic anhydride THPA and 390 g solvent I-150 when the acid value of analysis is less than 1 mgKOH/g and implement reaction 5 h when the temperature is at 110° C.; then add 55 g solvent KA and 55 g I-150 to dilute until the solid content is 65% to obtain the photopolymerizable prepolymer (oligomer) A1 with acid value of analysis of 60 mgKOH/g and weight average molecular weight Mw of 1839.

Synthesis Example 2: Photopolymerizable Prepolymer (Oligomer)-A2

Add 378 g solvent KA to 1000 g polyphenyl ether modified benzaldehyde novolac multifunctional epoxy resin (produced by Nan Ya Plastics Corporation, with trademark NPPN-433P and EEW of 316 g/eq); add 4.0 g triphenyl phosphine and 1.0 g hydroquinone HQ after heating the mixture to 100° C., stir and dissolve the mixture and drop 227 g acrylic acid AA to the above-mentioned solution to carry out reaction, wherein the time of dropping shall be 90 min; the temperature during dropping shall be at 95° C.; implement ripening reaction for 12 h after dropping and reaction for 5 h after adding 327 g tetrahydrophthalic anhydride THPA and 378 g solvent I-150 when the temperature is at 110° C.; then add 41 g solvent KA and 41 g I-150 to dilute until the solid content is 65% to obtain the photopolymerizable prepolymer (oligomer) A2 with acid value of analysis of 77 mgKOH/g and weight average molecular weight Mw of 1872.

Synthesis Example 3: Photopolymerizable Prepolymer (Oligomer)-A3

Add 405 g solvent KA to 1000 g phenol-benzaldehyde novolac multifunctional epoxy resin (produced by Nan Ya Plastics Corporation, with trademark NPPN-433 and EEW of 230 g/eq); add 5.4 g triphenyl phosphine and 1.0 g hydroquinone HQ after heating the mixture to 100° C., stir and dissolve the mixture and drop 312 g acrylic acid AA to the above-mentioned solution to carry out reaction, wherein the reaction time of dropping shall be 90 min; the temperature during dropping shall be at 95° C.; implement ripening reaction for 12 h by heating the mixture to 120° C. after dropping; carry out reaction for 5 h after adding 450 g tetrahydrophthalic anhydride THPA and 405 g solvent I-150 when the temperature is at 110° C.; then add 71 g solvent KA and 71 g I-150 to dilute until the solid content is 65% to obtain the photopolymerizable prepolymer (oligomer) A3 with acid value of analysis of 59 mgKOH/g and weight average molecular weight Mw of 2267.

Comparison Example: Photopolymerizable Prepolymer (Oligomer)-A4

Add 392 g solvent KA to 1000 g o-cresol phenolic multifunctional epoxy resin (produced by Nan Ya Plastics Corporation, with trademark NPPN-704 and EEW of 210 g/eq); add 6.0 g triphenyl phosphine and 1.2 g hydroquinone HQ after heating the mixture to 100° C., stir and dissolve the mixture and drop 342 g acrylic acid AA to the above-mentioned solution to carry out reaction, wherein the time of dropping shall be 90 min: the temperature during dropping shall be at 95° C.; implement ripening reaction for 12 h after dropping and reaction for 4 h after adding 384 g tetrahydrophthalic anhydride THPA and 392 g solvent I-150 when the temperature is at 110° C.; then add 128 g solvent KA and 128 g I-150 to dilute until the solid content is 62.5% to obtain the photopolymerizable prepolymer (oligomer) A4 with acid value of analysis of 51 mgKOH/g and weight average molecular weight Mw of 6000.

Examples 1~4

The low Dk/Df photopolymerizable prepolymer (oligomer) of the invention can be substituted into the formula of the solder resistant composition with components detailed in Table 1, and the photoresist ink composition can be acquired after grinding comprehensively by using SAMBON roller grinding machine. The printed circuit board of 20-30 μm thickness can be acquired after coating the photoresist ink composition acquired by the method onto the copper printed circuit board having patterns by using the printing method in presence of screen. The membrane can be adhered to the coating by using the negative coating having photoresist patterns closely after drying for 30 min by using the hot air drier at 80° C., and irradiated by ultraviolet light with dosage of 25 mW/square centimeter by using the ultraviolet exposure device (of HMW-680GW type produced by ORC Company). Then the part not exposed can be dissolved and eliminated by developing for 60 s in presence of spraying pressure of 2.0 kg/square centimetre of 1% aqueous solution of sodium carbonate. Of course, the aqueous solutions of weak base of other types can also be used. Finally, the membrane hardened completely can be acquired after baking 0.5-1 h at 100-200° C. in order to increase the heat resistant performance.

Comparison Example 1

The comparison example involves that substitution of the common photopolymerizable prepolymer (oligomer) into the formula of the solder resistant composition, and the formula is detailed in the Table 1.

bake the circuit board 40 min in the drier at 75° C.; take out the circuit board from the drier and cool it to room temperature naturally.

Developing Condition:
Concentration of developing solution: 1.0±0.2% $Na_2CO_3$ aqueous solution.
Spray pressure: 2.5±0.5 Kg/cm2
Developing temperature: at 30~33° C.
◉: Complete developing
○: The trace part cannot be developed.
Δ: One part cannot be developed completely.
x: Cannot develop completely.
Adhesion

TABLE 1

Constitution form of formulas of embodiments and comparison example

| Component Project | Embodiment 1 | Embodiment 2 | Embodiment 3 | Embodiment 4 | Comparison example 1 |
|---|---|---|---|---|---|
| Photopolymerizable prepolymer (oligomer) (synthesis case 1-A1) | 44.8 | 44.8 | — | — | — |
| Photopolymerizable prepolymer (oligomer) (synthesis case 2-A2) | — | — | 44.8 | — | — |
| Photopolymerizable prepolymer (oligomer) (synthesis case 3-A3) | — | — | — | 44.8 | — |
| Photopolymerizable prepolymer (oligomer) (synthesis case-A4) | — | — | — | — | 44.8 |
| DPHA (dipentaerythritolpentaacrylate), acrylic monomer | 5.0 | 5.0 | 5.0 | 5.0 | 5.0 |
| dicyclo pentadiene-phenol novolac multifunctional epoxy resin (produced by Nan Ya Plastics Corporation, NPPN-272H) | 6.2 | 6.2 | — | — | — |
| PPE polyphenyl ether modified benzaldehyde novolac multifunctional epoxy resin (produced by Nan Ya Plastics Corporation, NPPN-433P) | — | — | 6.2 | — | — |
| Phenol-benzaldehyde novolac multifunction epoxy resin (produced by Nan Ya Plastics Corporation, NPPN-433) | — | — | — | 6.2 | — |
| Tetramethyl diphenol epoxy resin | 7.2 | 7.2 | 7.2 | 7.2 | 7.2 |
| Active ester resin | — | 7.5 | 7.5 | 7.5 | — |
| Photoinitiator | 5.6 | 5.6 | 5.6 | 5.6 | 5.6 |
| Filler | 24.3 | 18.6 | 18.6 | 18.6 | 32.3 |
| Accelerant | 0.2 | 0.2 | 0.2 | 0.2 | 0.2 |
| Solvent | 4.9 | 4.9 | 4.9 | 4.9 | 4.9 |
| Total | 100 | 100 | 100 | 100 | 100 |
| Developability (developing time: 90~120 s) | ◉ | ◉ | ◉ | ◉ | ◉ |
| Pencil hardness (H) | 5 | 5 | 5 | 5 | 7 |
| Adhesion | ◉ 100/100 | ◉ 100/100 | ◉ 100/100 | ◉ 100/100 | ◉ 100/100 |
| Heat resistance to solder spray of taphole (270° C.) | 3 times, pass | 3 times, pass | 3 times, pass | 3 times, pass | 3 times, pass |
| Soldering resistance of plug-in (260° C.) | 3 times, pass | 3 times, pass | 3 times, pass | 3 times, pass | 3 times, pass |
| Dielectric constant Dk(1 GHz) | 3.05 | 3.00 | 2.90 | 3.05 | 3.6 |
| Dissipation factor Df(1 GHz) | 0.011 | 0.010 | 0.010 | 0.011 | 0.025 |

Test of weight average molecular weight (Mw) Dissolve the sample in the THF to prepare the solution with concentration of 0.5-2.0%; implement injection and analysis by using gel chromatograph, and set up correction curve chart of weight average molecular weight Mw/Mn by using the polystyrene standard.

Developability

Brush and grind (linear speed: 2M/min; acid leach: 3% sulfuric acid; and drying: 90° C.) the test board clearly and coat the ink on the circuit board by using the screen of 36T;

The hardening mould shall have the part of lattice according to the test method specified by JIS D 0202. Moreover, the peeling condition can be evaluated with eyes after peeling test by using Sailuofan adhesive tape.

◉: 100/100, that is, no peeling occurs to 100 parts.
○: 100/100, the minority of the part is peeled.
Δ: 50/100~90/100, that is, parts 50-90 in 100 are kept without peeling.
x: 0/100~50/100, that is, parts 0-50 in 100 are kept without peeling.

Pencil Hardness

Grind the tip (into right angle) of the 2B~9H pencil produced by Mitsubishi after manufacturing the test slide by using the method of adhesion and scratch the test slide with angle of 45 degrees until the coating is scratched.

Heat Resistance to Solder Spray of Taphole

Brush and grind (linear speed: 2M/min; acid leach: 3% sulfuric acid; and drying: 90° C.) the test board clearly and coat the ink on the test board by using the screen of 36T, wherein the wet coating shall be 36-42 μm; each hole of the taphole part shall be full of ink and pre-baked 40 min at 75° C.; implement hardening with UV exposure energy of 500 mJ/cm2 and hardening by means of segmented baking 30 min at 85° C., 30 min at 120° C. and 60 min at 15° C.; coat the soldering flux (known) on the circuit board hardened, spray tin for 10 s each time at 270° C. until peel occurs (next test can be implemented when the board is cooled each test); and stop the test if no peeling occurs after three times of tests.

Wave Soldering Resistance of Plug-in

Brush and grind (linear speed: 2M/min; acid leach: 3% sulfuric acid; and drying: 90° C.) the test board clearly and coat the ink on the test board by using the screen of 36T, wherein the wet coating shall be 36-42 μm; hardening the circuit board by using the hardening method mentioned in heat resistance to solder spray of tap hole; test the circuit board after hardening by using the wave welder under the conditions that the pre-heating section is at 250° C., the temperature of tin is at 260° C., the linear speed is at 1.3M/min, the soldering flux is KESTER 984, and the acid value of the soldering flux is 17~25 mgKOH/g until peeling occurs (next test can be implemented when the board is cooled each test); and stop the test if no peeling occurs after three times of tests.

Test of Dielectric Constant (Dk):

The test method comprises: harden the coating with thickness of 100 um by using the 5 cm×5 cm square ink, clamp the test plate into the dielectric constant tester and acquire the average value after measuring the data of three points.

Test of Dissipation Factor (Df):

The test method comprises: harden the coating with thickness of 100 um by using the 5 cm×5 cm square ink, clamp the test plate into the dielectric constant tester and acquire the average value after measuring the data of three points.

The embodiments 1-4 and the comparison example in the above-mentioned form show that the photopolymerizable prepolymer (oligomer) can be by reacting the dicyclo pentadiene-phenol novolac multifunctional epoxy resin with the acrylic acid and reacting with the methyl tetradrophthalic anhydride in the embodiment 1; the photopolymerizable prepolymer (oligomer) can be by reacting the dicyclo pentadiene-phenol novolac multifunctional epoxy resin with the acrylic acid and reacting with the methyl tetradrophthalic anhydride, and the active ester resin is added to the photopolymerizable prepolymer (oligomer) in the embodiment 2; the photopolymerizable prepolymer (oligomer) can be by reacting the polyphenyl ether modified multifunctional epoxy resin with the acrylic acid and reacting with the methyl tetradrophthalic anhydride, and the active ester resin is added to the photopolymerizable prepolymer (oligomer) in the embodiment 3; the photopolymerizable prepolymer (oligomer) can be by reacting the phenol-benzaldehyde novolac multifunction epoxy resin with the acrylic acid and reacting with the methyl tetradrophthalic anhydride; the photopolymerizable prepolymer (oligomer) synthesized in the above-mentioned embodiments 1-4 are substituted into the solder resist ink produced according to the formula and compared with the comparison example, wherein the dielectric constant can be reduced between 3.2 from 3.6, and the dissipation factor can be reduced below 0.015 from 0.025; and the solder resist ink is applicable for printed circuit board for high-frequency high-speed signal transmission.

SYMBOL DESCRIPTION

None

What we claimed is:

1. A low dielectric constant (Dk)/dissipation factor (Df) solder resistant composition, comprising following components:
A) a photopolymerizable prepolymer of formula (1), which is 20 to 70 weight %, wherein the photopolymerizable prepolymer of formula (1) is prepared by reacting (a) an epoxy resin with (b) a mono carboxylic acid including a vinyl group, then reacting with (c) a saturated or unsaturated anhydride; wherein the epoxy resin is (a1) dicyclo pentadiene-phenol novolac multifunctional epoxy, or (a2) polyphenyl ether modified multifunctional epoxy resin or a combination thereof;
B) a photopolymerizable vinyl monomer which is 5 to 20 weight % and used as thinner;
C) an epoxy compound which is 5 to 30 weight %, the epoxy compound includes (C1) dicyclo pentadiene-phenol novolac multifunctional epoxy resin or polyphenyl ether modified epoxy resin or a combination thereof, and (C2) tetra methyl biphenol epoxy resin;
D) a photopolymerization initiator which is 2 to 10 weight %;
E) an inorganic filler which is 10 to 50 weight %;
F) a catalyst or accelerant which is 0 to 2.0 weight %;
G) an organic solvent which is 10 to 40 weight %;

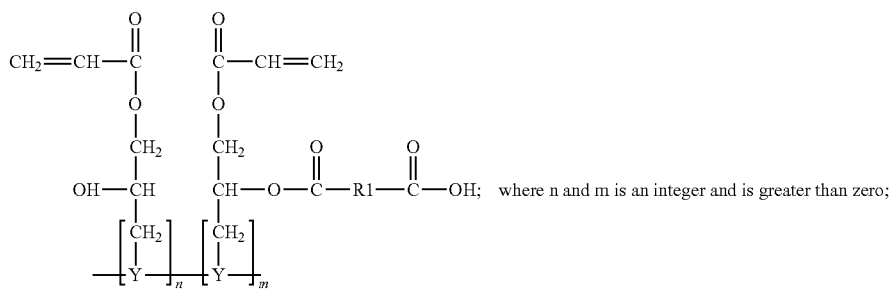

formula (1)

-continued

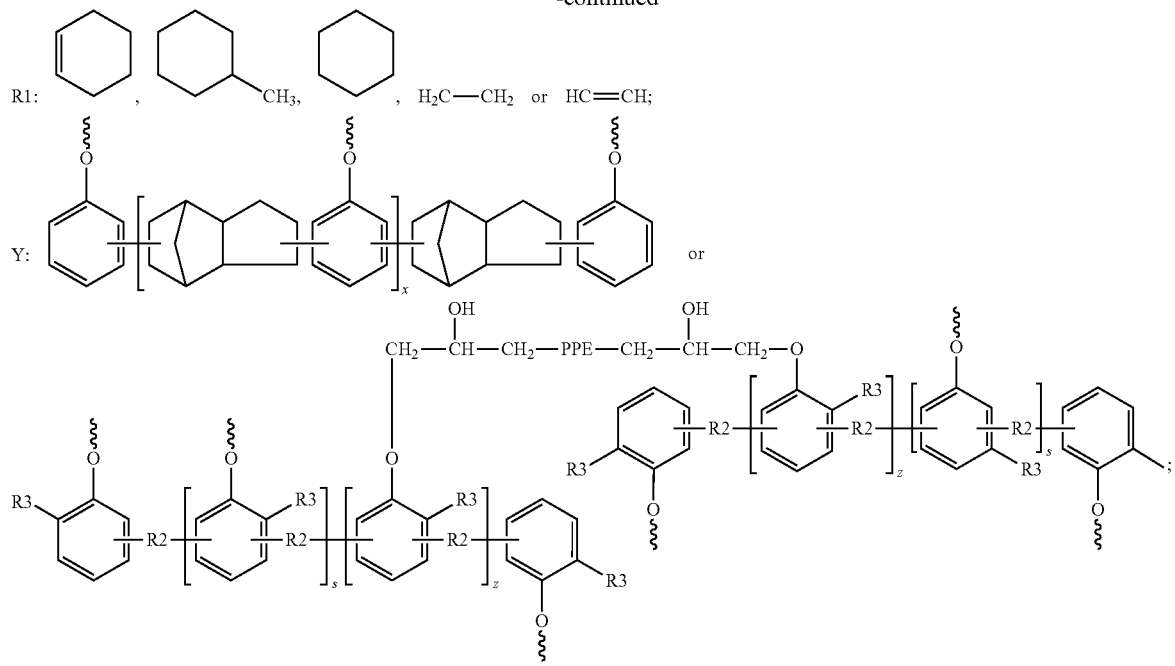

where x, s, and z each is an integer and greater than 0;

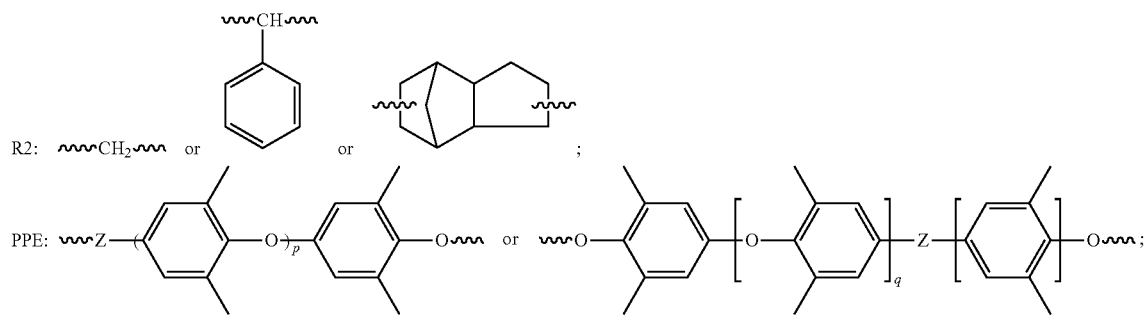

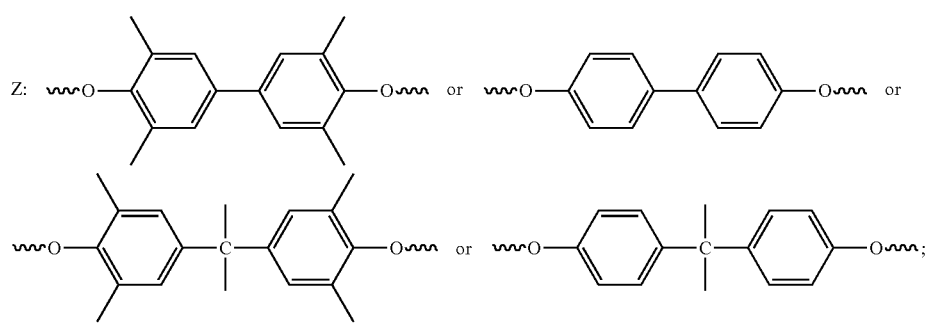

wherein the low dielectric constant (Dk)/dissipation factor (Df) solder resistant composition has the dielectric constant Dk less than 3.20 (1 GHz) and the dissipation factor Df less than 0.015 (1 GHz).

2. The composition as claimed in claim 1, wherein the photopolymerizable prepolymer of formula (1) of the component A is 30-60 weight %.

3. The composition as claimed in claim 1, wherein the (c) saturated anhydride of the components (A) is selected from the group consisting of succinic anhydride, maleic anhydride, hexahydrophthalic anhydride, cis-4-methyl-1,2,3,6-tetrahydrophthalic anhydride, and 2,3,6-tetrahydro-3-phthalic anhydride.

4. The composition as claimed in claim 1, wherein the amount of the component (B) photopolymerizable vinyl monomer is 5 to 15 weight % and the component (B) is selected from the group consisting of 2-hydroxyethyl acrylate, 2-hydroxybutyl acrylate, alkyl amine acrylic acid compound, multifunctional acrylate of propylene oxide, acrylate of allyl glycidyl ether, and multifunctional acrylate of dipentaerythritol.

5. The composition as claimed in claim 1, wherein the amount of the component (C) epoxy resin compound is 10 to 25 weight %, and the epoxy resin compound is selected from (C1) dicyclo pentadiene-phenol novolac multifunctional epoxy resin or polyphenyl ether modified epoxy resin or a combination of the above-mentioned two epoxy resins; and (C2) tetramethyl biphenol epoxy resin.

6. The composition as claimed in claim 1, wherein the amount of the component (D) photopolymerization initiator is 2 to 8 weight %, and the photopolymerization initiator is selected from the group consisting of benzoin methyl ether, benzoin, isopropyl ether, 2,2-dimethyl-2-phenyl acetophenone, 1,1-dichloroacetophenone, 1-hydroxy cyclohexyl phenyl ketone, 2-methyl-1-[4-(methylthio) phenyl]-2-morpholinylacet-1-one, N,N-dimethyl amino acetophenone, benzophenone dimethyl acetal, diphenylketone, methyl diphenylketone, 4,4'-dichlorobenzophenone, 4,4'-diethylamino phenyl ketone, Michler's ketone, and 4-phenylmethylacyldiphenyl phosphorus oxide.

7. The composition as claimed in claim 1, wherein the amount of the component (E) inorganic filler is 15 to 35 weight %, and the inorganic filler is selected from the group consisting of talcum powder, magnesium carbonate, calcium carbonate, alumina and powder of silicon dioxide.

8. The composition as claimed in claim 1, wherein the amount of the component (F) catalyst or accelerant is 0.1 to 1.0 weight %, and the catalyst or accelerant is selected from the group consisting of imidazoles, quaternary ammonium compounds, quaternary phosphates, and dimethyl imidazole, diphenylimidazole, and bis(hydroxymethyl) diphenylimidazole.

9. The composition as claimed in claim 1, wherein the amount of the component (G) organic solvent is 10 to 30 weight %, and the organic solvent is selected from the group consisting of propylene carbonate, butoxyethanol, butoxyethyl acetate, methylbenzene, dimethylbenzene, butyl carbitol acetate, cyclohexanone, propylene glycol monomethyl ether, dipropylene glycol diethyl ether, and methyl carbitol acetate.

* * * * *